United States Patent
Heck et al.

(10) Patent No.: US 7,510,907 B2
(45) Date of Patent: Mar. 31, 2009

(54) THROUGH-WAFER VIAS AND SURFACE METALLIZATION FOR COUPLING THERETO

(75) Inventors: John Heck, Berkeley, CA (US); Qing Ma, San Jose, CA (US); Quan Tran, Fremont, CA (US); Tsung-Kuan Allen Chou, San Jose, CA (US); Semeon Altshuler, Rishon-le-Zion (IL); Boaz Weinfeld, Jerusalem (IL)

(73) Assignee: Intel Corporation, Santa Clara, CA (US)

( * ) Notice: Subject to any disclaimer, the term of this patent is extended or adjusted under 35 U.S.C. 154(b) by 400 days.

(21) Appl. No.: 11/165,465

(22) Filed: Jun. 22, 2005

(65) Prior Publication Data

US 2006/0289967 A1 Dec. 28, 2006

(51) Int. Cl.
*H01L 21/44* (2006.01)
(52) U.S. Cl. .............. 438/106; 438/107; 438/110; 257/E33.056
(58) Field of Classification Search .......... 438/667, 438/106, 107, 110
See application file for complete search history.

(56) References Cited

U.S. PATENT DOCUMENTS

| 5,404,044 | A | 4/1995 | Booth et al. |
| 5,994,763 | A | 11/1999 | Ohmuro |
| 6,002,177 | A | 12/1999 | Gaynes et al. |
| 6,671,947 | B2 * | 1/2004 | Bohr ............ 29/846 |
| 2003/0207566 | A1 * | 11/2003 | Forbes et al. ....... 438/667 |

FOREIGN PATENT DOCUMENTS

EP      1 073 103 A1     1/2001

OTHER PUBLICATIONS

PCT/US2006/024722, PCT International Search Report and Written Opinion, Jan. 17, 2007.

* cited by examiner

*Primary Examiner*—Thanh Nguyen
(74) *Attorney, Agent, or Firm*—Blakely, Sokoloff, Taylor & Zafman LLP

(57) ABSTRACT

An apparatus and method of fabricating a through-wafer via. A first mask is formed over a first side of a first semiconductor die to define a first via area. A deep recess is etched through the first semiconductor die in the first via area and a blanket metal layer is formed over the first side including the deep recess. The blanket metal layer is removed from an outer surface of the first side of the first semiconductor die while retaining a portion of the blanket metal layer within the deep recess.

15 Claims, 4 Drawing Sheets

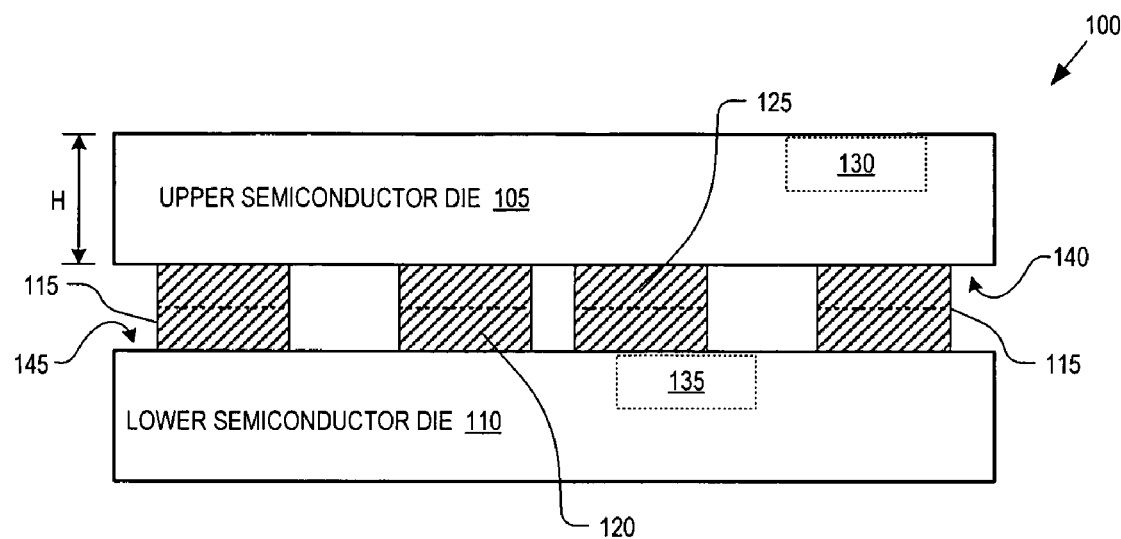
FIG. 1
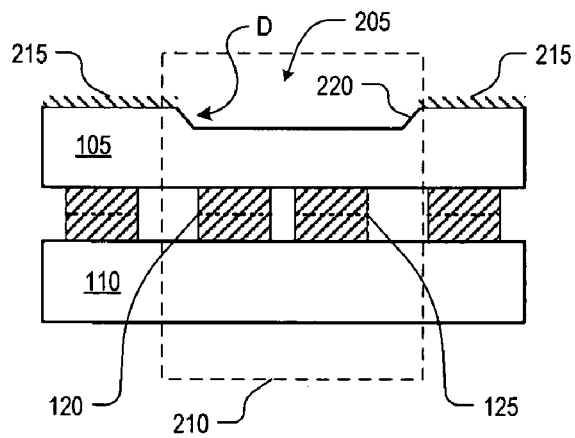 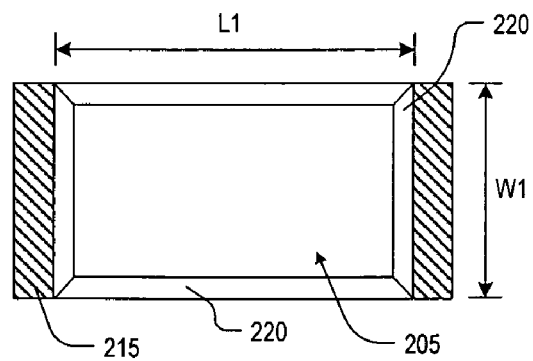
FIG. 2A  FIG. 2B

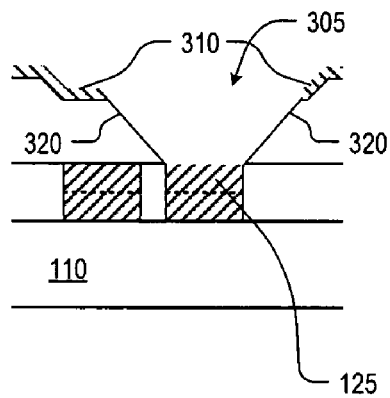
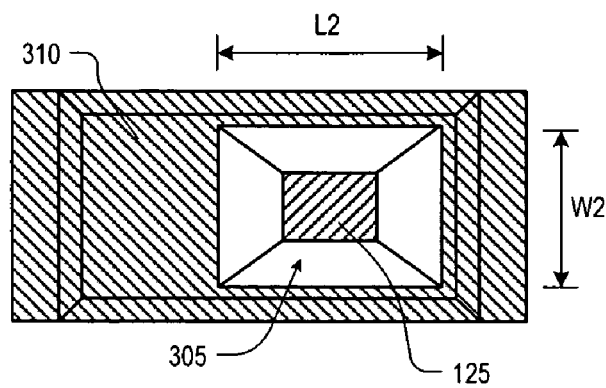
FIG. 3A  FIG. 3B
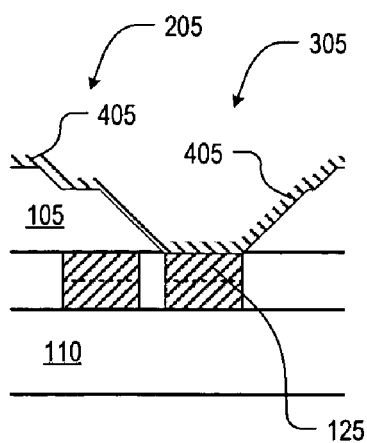
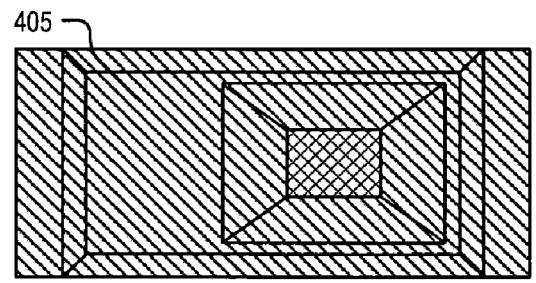
FIG. 4A  FIG. 4B

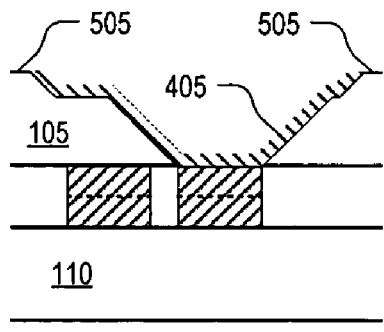
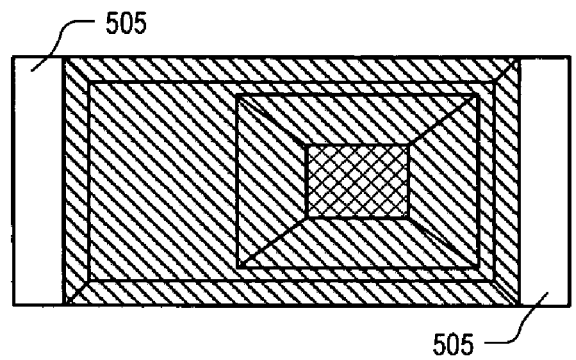
FIG. 5A  FIG. 5B
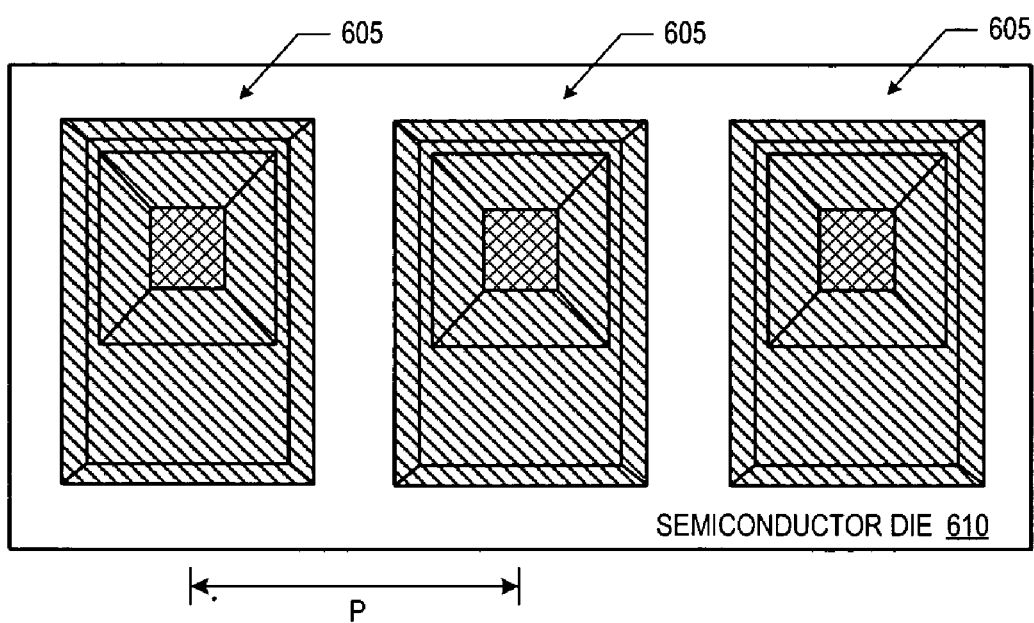
FIG. 6

THROUGH-WAFER VIAS AND SURFACE METALLIZATION FOR COUPLING THERETO

TECHNICAL FIELD

This disclosure relates generally to fabrication of vias in a semiconductor die, and in particular but not exclusively, relates to surface metallization and through-wafer vias.

BACKGROUND INFORMATION

Modern semiconductor devices may comprise thousands or even millions of components (e.g., transistors, interconnects, pads, etc.) integrated into a single die. As such, semiconductor real estate is a premium asset not to be squandered by an integrated circuit ("IC") designer. To maximize the useable real estate of a single die, components may be integrated onto the front side as well as the backside of the die. To interconnect a dual sided die, through-wafer vias are formed throughout the die coupling the topside of the die to the bottom side of the die.

Another technique used to maximize the number of components within a single device is to stack two or more semiconductor dice together in what is called a bonded wafer stack. Components within these bonded wafer stacks are then interconnected using through-wafer vias. Known techniques form these through-wafer vias with a deep reactive ion etching process, requiring expensive tools. Not only is deep reactive ion etching expensive, but it is a slow fabrication technique.

Redistribution features (e.g., transmission lines) are often formed on the surface of a die to couple a via to other component locations. Current processes struggle with the challenge of coating straight sidewalls with metal to form the redistribution features. Typically, thicker metal layers are deposited to overcome these coating issues, with the detrimental side effect of increased incidence of stress induced wafer breakage. Known processes use additional lithography and metal plating processing, separate from via formation, to form these redistribution features. Similarly, known techniques require that the metallization of the vias be patterned after via formation using an additional high-aspect-ratio lithography process.

BRIEF DESCRIPTION OF THE DRAWINGS

Non-limiting and non-exhaustive embodiments of the invention are described with reference to the following figures, wherein like reference numerals refer to like parts throughout the various views unless otherwise specified.

FIG. 1 is a cross-sectional diagram illustrating interconnecting two semiconductor dice into a bonded wafer stack, in accordance with an embodiment of the invention.

FIG. 2A is a cross-sectional diagram illustrating formation of a shallow recess on a die surface, in accordance with an embodiment of the invention.

FIG. 2B is a plan view diagram illustrating formation of a shallow recess on a die surface, in accordance with an embodiment of the invention.

FIG. 3A is a cross-sectional diagram illustrating formation of a deep recess through a die, in accordance with an embodiment of the invention.

FIG. 3B is a plan view diagram illustrating formation of a deep recess through a die, in accordance with an embodiment of the invention.

FIG. 4A is a cross-sectional diagram illustrating formation of a blanket metal layer over a die surface having a through-wafer via formed therein, in accordance with an embodiment of the invention.

FIG. 4B is a plan view diagram illustrating formation of a blanket metal layer over a die surface having a through-wafer via formed therein, in accordance with an embodiment of the invention.

FIG. 5A is a cross-sectional diagram illustrating removal of a blanket metal layer from a die surface, in accordance with an embodiment of the invention.

FIG. 5B is a plan view diagram illustrating removal of a blanket metal layer from a die surface, in accordance with an embodiment of the invention.

FIG. 6 illustrates a plan view of multiple through-wafer vias formed on a semiconductor die, in accordance with an embodiment of the invention.

DETAILED DESCRIPTION

Figure 7:
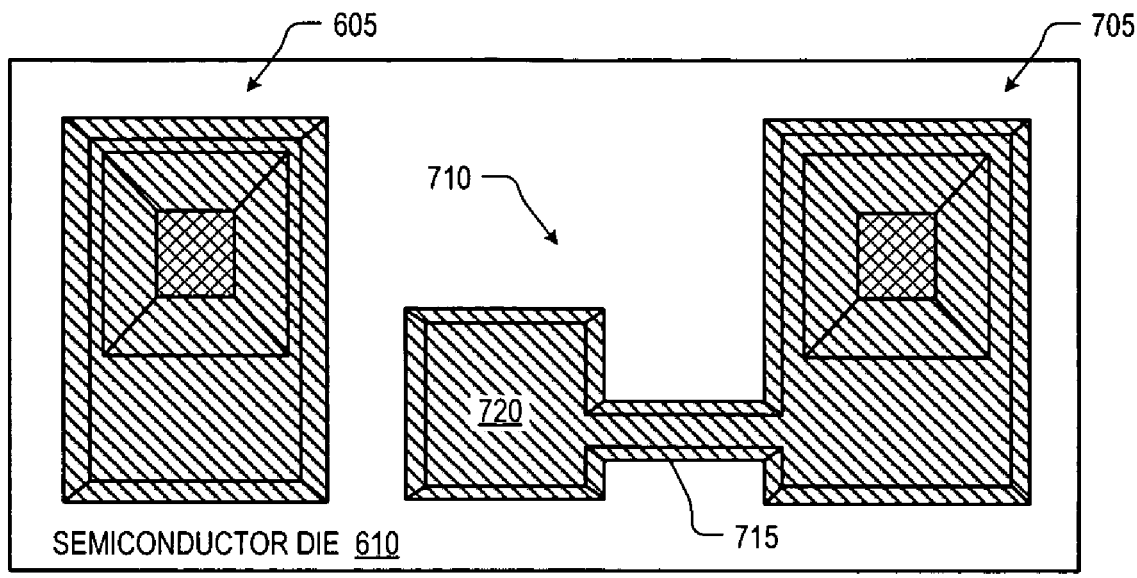
FIG. 7 illustrates a plan view of a through-wafer via coupled to a redistribution feature, in accordance with an embodiment of the invention.

Techniques for through-wafer via formation and surface metallization for coupling features to the through-wafer vias are described below with reference to FIGS. 1-8. These techniques provide a low cost through-wafer via and surface metallization solution amenable to high volume manufacturing ("HVM"). In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

FIG. 1 is a cross-sectional diagram illustrating interconnecting two semiconductor dice into a bonded wafer stack 100, in accordance with an embodiment of the invention. The illustrated embodiment of bonded wafer stack 100 includes an upper semiconductor die 105 and a lower semiconductor die 110 bonded together with seal rings 115, support contacts 120 and via contacts 125. It should be appreciated that FIGS. 1-8 are not drawn to scale; rather, these figures are merely intended for illustration.

Upper and lower semiconductor dice 105 and 110 may represent any semiconductor dice bonded together and may each further include circuit components 130 and 135 (e.g., logic elements, memory elements, redistribution elements, transistors, bonding pads, etc.) integrated within the semiconductor dice or on a surface of the semiconductor dice. For example, in one embodiment, lower semiconductor die 110 may be a micro-electro-mechanical system ("MEMS") die (also referred to as a MEMS wafer) with circuit components 135 representing MEMS devices integrated onto a surface of lower semiconductor die 110. Furthermore, upper semiconductor die 105 may be a cap die (also referred to as a cap wafer or lid wafer) to cover and to protect the lower MEMS wafer and to prevent dust and debris from fowling the MEMS devices. Further, upper and lower semiconductor dice 105 and 110 may be formed of silicon substrates, gallium-arsenide substrates, or other semiconductor substrates. Although only a two layer bonded wafer stack 100 is illustrated in FIG. 1, the techniques described herein may be used to electrically interconnect components on bonded wafer stacks having three or more layers.

FIG. 1 illustrates a process of bonding upper semiconductor die 105 to lower semiconductor die 110 to form both a mechanical and electrical interconnection. In one embodiment, prior to bonding upper and lower semiconductor dice 105 and 110, seal rings 115, support contacts 120, and via contacts 125 are formed on a bonding surface 140 of upper semiconductor die 105 and on a bonding surface 145 of lower semiconductor die 110. Seal rings 115, support contacts 120, and via contacts 125 formed on each of the bonding surfaces 140 and 145 are then aligned, brought together and bonded. In one embodiment, seal rings 115, support contacts 120 and via contacts 125 are formed of metal (e.g., gold, copper, aluminum, silver, etc.) and attached via thermocompression (e.g., gold thermocompression). Other bonding techniques may be applied including soldering, eutectic bonding, anodic bonding, fusion, and the like.

As illustrated, seal rings 115, support contacts 120, and via contacts 125 are bonded along the dashed lines drawn through each of the contacts and seal rings. Via contacts 125 form an electrical interconnect between upper and lower semiconductor dice 105 and 110. As discussed below, a via is formed through upper semiconductor die 105 above via contacts 125 and after metallization enables electrical interconnection between components 130 (e.g., bonding pads, etc.) integrated into upper semiconductor die 105 and components 135 integrated into lower semiconductor die 110. In one embodiment, support contacts 120 are positioned adjacent to each via contact 125 to provide mechanical support to upper semiconductor die 105. In one embodiment, contact regions or bonding pads may be formed on the top surface of semiconductor die 105 directly above support contacts 120. In this embodiment, support contacts 120 bear the load that may be applied to upper semiconductor die 105 during attachment of an electrical lead to the bonding pad. In one embodiment, seal rings 115 not only provide mechanical support and rigidity to the bonding interconnection between upper and lower semiconductor dice 105 and 110, but also provide a seal barrier to prevent dust and debris from fowling components 135 integrated onto lower semiconductor die 110. Seal rings 115 may surround the perimeter of bonding surfaces 140 and 145 or form a perimeter around components 135 integrated onto bonding surface 145 of lower semiconductor die 110.

In one embodiment, once upper semiconductor die 105 is bonded to lower semiconductor die 110, upper semiconductor die 105 may be thinned or back-grinded to a desired thickness H. Thickness H may range between 20 µm to 250 µm, though upper semiconductor die 105 may be thinned to other thickness outside this range. In one embodiment where upper semiconductor die 105 is a cap wafer, upper semiconductor die 105 may be back grinded to a thickness H of 50 µm.

FIGS. 2A and 2B illustrate formation of a shallow recess 205 in the top (or outer) surface of upper semiconductor die 105, in accordance with an embodiment of the invention. FIG. 2A is a cross-sectional illustration of bonded wafer stack 100, while FIG. 2B illustrates a plan view of a portion of bonded wafer stack 100 delineated in FIG. 2A by dashed line 210. After thinning upper semiconductor die 105 to the desired thickness H, a first mask 215 is deposited on the top surface of upper semiconductor die 105. Lithography may then be used to pattern a shallow via area within first mask 215 having a length L1 and a width W1. In one embodiment, first mask 215 may be a gold hardmask approximately 0.2 to 0.5 µm thick.

After the shallow via area is patterned into first mask 215, shallow recess 205 is etched to a depth D, approximately between 5 to 20 µm (other depths D may be used). Shallow recess 205 may be etched using a chemical wet etch, a dry plasma etch, a vapor phase etch, or the like. In an embodiment using a chemical wet etch, various etching chemicals may be used, such as Potassium Hydroxide (KOH), Ethylene-Diamine Pyrochatechol (EDP), Tetramethyl Ammonium Hydroxide (TMAH), or the like.

If the KOH etchant is used, a thin Ti primer layer may be deposited below the gold hardmask prior to depositing first mask 215. Furthermore, as illustrated in FIGS. 2A and 2B, KOH etches silicon along the 1-1-1 and 1-0-0 planes creating shallow sidewalls 220 having an angle of ≈54.7°.

FIGS. 3A and 3B illustrate formation of a deep recess 305 in the top (or outer) surface of upper semiconductor die 105, in accordance with an embodiment of the invention. FIG. 3A is a cross-sectional illustration of the portion of bonded wafer stack 100 delineated in FIG. 2A by dashed line 210, while FIG. 3B illustrates a corresponding plan view. After etching shallow recess 205, a second mask 310 is deposited onto upper semiconductor die 105 and lithographically patterned to define a deep via area within the shallow via area having a length L2 and width W2. In one embodiment, a gold hardmask is used again.

After forming the second mask 310, deep recess 305 is etched into upper semiconductor die 105 down to via contact 125 to form a through-wafer via extending from the outer surface through to the inner surface (or bonding surface 140). In one embodiment, KOH is used to etch deep recess 305. In an embodiment where KOH is used to etch a silicon semiconductor die, the KOH etchant etches the silicon at an angle of ≈54.7° creating angled sidewalls 320. Accordingly, the thickness H of upper semiconductor die 105 (see FIG. 1) should be selected to achieve the desired through-wafer via density or pitch between a through-wafer via and an adjacent component. Thinning upper semiconductor die 105 to ≈50 µm enables sufficiently fine pitch for most applications while retaining sufficient mechanical strength.

FIGS. 4A and 4B illustrate formation of a blanket metal layer 405 over the topside of upper semiconductor die 105, in accordance with an embodiment of the invention. FIG. 4A is a cross-sectional illustration of the portion of bonded wafer stack 100 delineated in FIG. 2A by dashed line 210, while FIG. 4B illustrates a corresponding plan view. In one embodiment, blanket metal layer 405 is formed by deposition of a gold layer having a thickness of 0.2 to 0.5 µm, though other metals and other thickness may be used. As illustrated, blanket metal layer 405 is formed over the entire topside of upper semiconductor die 105 including within shallow recess 205 and deep recess 305. Blanket metal layer 405 is deposited to form an electrical contact with via contact 125. Accordingly, if multiple through-wafer vias and corresponding via contacts 125 are formed on upper semiconductor die 125, then each of these through-wafer vias are electrically shorted by blanket metal layer 405. In one embodiment, a high-resistivity silicon wafer (e.g., resistivity≈10 kΩ·cm) is used to fabricate upper semiconductor die 105 and therefore a dielectric via insulation layer is not used. In other embodiments, a dielectric via insulation layer is deposited and patterned prior to depositing blanket metal layer 405.

FIGS. 5A and 5B illustrate removal of blanket metal layer 405 from an outer surface 505 of upper semiconductor die 105, in accordance with an embodiment of the invention. FIG. 5A is a cross-sectional illustration of the portion of bonded wafer stack 100 delineated in FIG. 2A by dashed line 210, while FIG. 5B illustrates a corresponding plan view. After blanket metal layer 405 is deposited over the topside side of upper semiconductor die 105 thereby shorting multiple through-wafer vias, the portion of blanket metal layer 405 residing on outer surface 505 is removed, thereby electrically isolating each of the through-wafer vias. The portion of blanket metal layer 405 residing on outer surface 505 may be removed by back-grinding blanket metal layer 405 down to outer surface 505. In one embodiment, a thin layer of upper semiconductor die 105 is removed to ensure no electrical shorts between through-wafer vias persist. The term "back-grinding" or just "grinding" is defined broadly herein to include any technique for mechanically removing blanket metal layer 405 from outer surface 505 using friction and may include polishing, buffing, rubbing, or the like. In one embodiment, blanket metal layer 405 may also be removed from outer surface 505 using a slicing technique similar to a planer, a lathe, a joiner, or the like.

Mechanical removal of blanket metal layer 405 from outer surface 505 enables metallization of through-wafer vias without need of additional masking and lithography process stages. Forming a mask on the surface of a wafer or die having deep recesses, such as deep recess 305 can be difficult and often results in radial streaks running from each deep recess towards the circumference of the wafer or die. Streaking results from techniques used to apply photoresist or other masking materials. Typically, the masking material is deposited in the middle of a spinning wafer. The centrifugal force of the spinning wafer spreads the masking material evenly over the topography of the wafer. However, if deep recesses or crevices are present, the masking material can accumulate in the deep recesses or crevices, leaving radial streaks absent of the masking material. Accordingly, embodiments of the invention avoid this problem, while at the same time skipping the expense associated with a complicated lithographic process over the topography of deep recess 305.

FIG. 6 illustrates a plan view of multiple through-wafer vias 605 formed on a semiconductor die 610, in accordance with an embodiment of the invention. As illustrated, any number of through-wafer vias 605 may be formed on and through semiconductor die 610 using the techniques described above. By careful selection of the thickness of semiconductor die 610 (e.g., see thickness H in FIG. 1), the pitch P between adjacent through-wafer vias 605 may be selected. The etching technique described above (e.g., chemical wet etching, plasma etching, vapor phase etching, etc.) forming shallow recess 205 and deep recess 305, is an inexpensive batch process amenable to HVM. Further, the grinding or slicing technique for metallization of through-wafer vias 605 is also an inexpensive batch process. Embodiments of the invention may not only be used to interconnect two distinct semiconductor dies or wafers, but also to interconnect the two sides of a single wafer (e.g., the topside and the backside or inner side of semiconductor die 105).

FIG. 7 illustrates a plan view of a through-wafer via 705 coupled to a redistribution feature 710, in accordance with an embodiment of the invention. In the illustrated embodiment, redistribution feature 710 includes a transmission line 715 and a contact pad 720. It should be appreciated that redistribution feature 710 may include an number of elements of varying size and lengths.

Redistribution feature 710 may be formed at the same time and using the same processes as through-wafer via 705. For example, the transmission line area and pad area defining transmission line 715 and contact pad 720 may be defined by first mask 215 used to define shallow recess 205. When shallow recess 205 is etch, so too are the transmission line recess and the pad recess for redistribution feature 710. Subsequently, when blanket metal layer 405 is deposited on the topside of semiconductor die 610, the transmission line recess and the pad recess are metallized along with the other through-wafer via 605. After metallization, the outer surface of semiconductor die 610 is back-grinded or sliced to remove blanket metal layer 405 from the outer surface 505 and electrically isolate through-wafer via 605 from through-wafer via 705.

Embodiments of the invention enable fabrication of redistribution features 710, such as transmission lines, interconnects, and bonding pads, without high-aspect-ratio lithography, and at the same time as formation of shallow recess 205. These redistribution features are metallized at the same time and using the same process stage to metallize through-wafer vias 605 and 705. Further, the shallow recess process may be used to form other features on the surface of semiconductor die 610 including inductors and the like.

Figure 8:
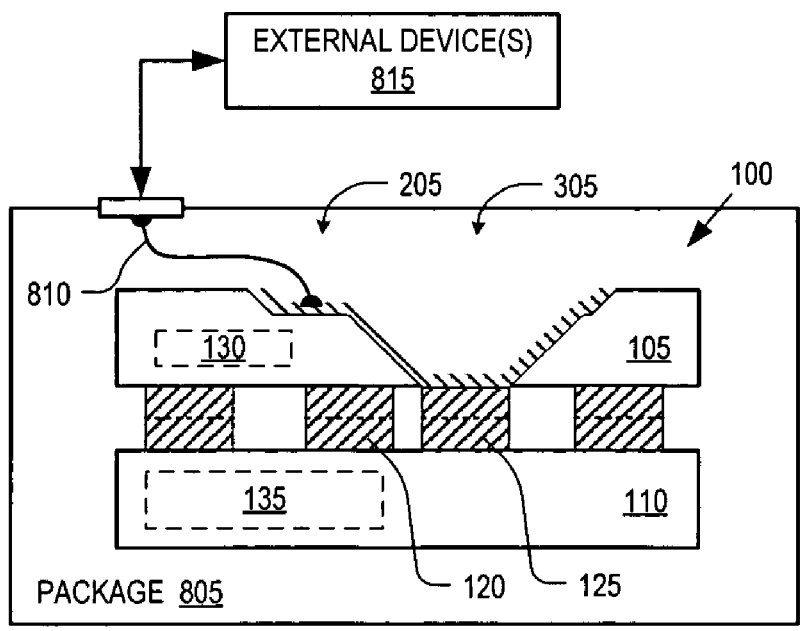
FIG. 8 is a schematic diagram illustrates a cross-sectional view of a bonded wafer stack interconnected with through-wafer vias and integrated into a package for coupling to external devices, in accordance with an embodiment of the invention.

FIG. 8 is a schematic diagram illustrates a cross-sectional view of bonded wafer stack 100 interconnected with a through-wafer via and integrated into a package 805, in accordance with an embodiment of the invention. As illustrated, a portion of shallow recess 205 outside of deep recess 305 provides a convenient place to bond an electrical lead 810 to external devices 815. Support contact 120 positioned below shallow recess 205 provide mechanical support for resisting pressure that may be applied during application of electrical lead 810. In other embodiments, electrical lead 810 may also be bonded within deep recess 305, such as directly on top of via contact 125. In yet another embodiment, electrical lead 810 may be bonded to a redistribution feature (e.g., contact pad 720) coupled to the through-wafer via.

In one embodiment, package 805 and external devices 815 may form a portion of a front-end-module of a wireless device (e.g., cell phone, WiFi client or base station, etc.). In this wireless device embodiment, components 135 may include MEMS devices, such as MEMS switches, which are sealed and protected by upper semiconductor die 105 (e.g., cap wafer), while external devices 815 may represent power amplifiers ("PAs"), low noise amplifiers ("LNAs"), and/or antenna(s) electrically coupled to the MEMS devices by way of electrical lead(s) 810 and the through-wafer via(s). The MEMS devices may provide mechanical switching for turning on/off the PAs and the LNAs and/or for switching between send and receive modes.

Although only a single through-wafer via and electrical lead 810 are illustrated in FIG. 8, it should be appreciated that the techniques described here may be used to couple any number of electrical leads 810 to any number of through-wafer vias for coupling to components 135 within lower semiconductor die 110 or for coupling to components integrated onto a backside of upper semiconductor die 105. Accordingly, the through-wafer vias described herein are not limited for use with bonded wafer stacks, but may also be used with single wafer integrated circuits.

In an alternative embodiment, the through-wafer vias described herein may be formed without formation of the first mask 215 and/or shallow recess 205. In other words, embodiments of the invention include through-wafer vias formed solely with deep recess 305 and back-grinding/slicing blanket metal layer 405. This alternative embodiment may be used if formation of redistribution features 710 on the topside of a semiconductor die are not desired for the particular design, if redistribution features 710 are to be formed using other techniques, to reduce the fabrication costs/time, or for other reasons.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. A method of fabrication, comprising:
   forming a first mask over a first side of a first semiconductor die to define a first via area;
   etching a deep recess through the first semiconductor die in the first via area;
   forming a blanket metal layer over the first side including the deep recess;
   removing the blanket metal layer from an outer surface of the first side of the first semiconductor die while retaining a portion of the blanket metal layer within the deep recess;
   forming a second mask prior to the first mask on the first surface of the first semiconductor die to define a second via area, wherein the first via area is defined within the second via area; and
   etching a shallow recess into the first semiconductor die in the second via area prior to etching the deep recess, and wherein forming the first mask over the first side of a first semiconductor die to define the first via area includes forming the first mask to cover a portion of the shallow recess,
   wherein forming the blanket metal layer over the first side including the deep recess further includes forming the blanket metal layer over the first side, the deep recess, and the shallow recess,
   wherein etching the deep recess and etching the shallow recess result in sloped sidewalls defining the deep recess and the shallow recess.

2. The method of claim 1, further comprising:
   forming a via contact on a second side of the first semiconductor die below the first via area,
   wherein etching the deep recess through the first semiconductor die in the first via area comprises etching the deep recess through the first semiconductor die to expose at least a portion of the via contact,
   wherein forming the blanket metal layer over the first side including the deep recess includes forming the blanket metal layer over the exposed portion of the via contact.

3. The method of claim 2, wherein removing the blanket metal layer from an outer surface of the first side comprises back-grinding the blanket metal layer off the outer surface of the first side of the first semiconductor die.

4. The method of claim 3,
   wherein forming the blanket metal layer over the first side including the deep recess and the shallow recess further includes forming the blanket metal layer over the the exposed portion of the via contact.

5. The method of claim 4,
   wherein forming the second mask further includes forming the second mask on the first surface to define an inductor area,
   wherein etching the shallow recess further includes etching the inductor area for form an shallow inductor recess; and
   wherein forming the blanket metal layer over the first side further includes forming the blanket metal layer over the shallow inductor recess to form an inductor.

6. The method of claim 4, wherein the second mask further defines a transmission line area and a pad area connecting to the second via area, wherein etching the shallow recess includes etching a transmission line recess and a pad recess, and wherein forming the blanket metal layer further includes forming the blanket metal layer within the transmission line recess and the pad recess.

7. The method of claim 4, further comprising:
   bonding a second semiconductor die to the first semiconductor die to form a bonded wafer stack; and
   coupling the via contact on the second side of the first semiconductor die to another via contact on the second semiconductor die to form an electrical interconnect between the first side of the first semiconductor die and the second semiconductor die.

8. The method of claim 7, further comprising:
   forming a first support contact beside the via contact on the second side of the first semiconductor die below the second via area outside the first via area; and
   forming a second support contact beside the other via contact on the second semiconductor die to align with the first support contact, the first and second support contacts to provide mechanical support to the second via area outside the first via area.

9. The method of claim 8, further comprising bonding an electrical lead to the second via area outside the first via area.

10. A method of fabrication, comprising:
    forming a first mask on a first surface of a semiconductor die to define a first via area;
    etching a shallow recess into the semiconductor die in the first via area;
    forming a second mask over the first surface of the semiconductor die to define a second via area within at least a portion of the first via area, wherein the second mask covers the portion of the first via area;
    etching a deep recess through the semiconductor die in the second via area;
    forming a blanket metal layer over the first side including the deep and shallow recesses; and
    removing the blanket metal layer from an outer surface of the first side of the semiconductor die while retaining a portion of the blanket metal layer within the deep and shallow recesses,
    wherein etching the deep recess and etching the shallow recess result in sloped sidewalls defining the deep recess and the shallow recess.

11. The method of claim 10, further comprising
    forming a via contact on a second side of the semiconductor die below the second via area, wherein etching the deep recess through the semiconductor die in the second via area comprises etching the deep recess through the semiconductor die to expose at least a portion of the via contact,
wherein forming the blanket metal layer over the first side including the deep recess includes forming the blanket metal layer over the exposed portion of the via contact.

12. The method of claim 11, wherein the semiconductor die comprises a first semiconductor die, the method further comprising:
bonding a second semiconductor die to the first semiconductor die to form a bonded wafer stack; and
coupling the via contact on the second side of the first semiconductor die to another via contact on the second semiconductor die to form an electrical interconnect between the first side and the first semiconductor die and the second semiconductor die.

13. The method of claim 10, wherein the first mask further defines a transmission line area and a pad area connecting to the first via area, wherein etching the shallow recess includes etching a transmission line recess and a pad recess, and wherein forming the blanket metal layer further includes forming the blanket metal layer within the transmission line recess and the pad recess.

14. A method of fabrication, comprising:
forming a first mask on a first surface of a semiconductor die to define a first via area;
etching a shallow recess into the semiconductor die in the first via area;
forming a second mask over the first surface of the semiconductor die to define a second via area within at least a portion of the first via area, wherein the second mask covers the portion of the first via area;
etching a deep recess through the semiconductor die in the second via area;
forming a blanket metal layer over the first side including the deep and shallow recesses; and
removing the blanket metal layer from an outer surface of the first side of the semiconductor die while retaining a portion of the blanket metal layer within the deep and shallow recesses,
wherein the first mask further defines a transmission line area and a pad area connecting to the first via area, wherein etching the shallow recess includes etching a transmission line recess and a pad recess, and wherein forming the blanket metal layer further includes forming the blanket metal layer within the transmission line recess and the pad recess.

15. The method of claim 14, wherein etching the deep recess and etching the shallow recess result in sloped sidewalls defining the deep recess and the shallow recess.

* * * * *